United States Patent
Minamihaba et al.

(10) Patent No.: US 7,332,104 B2
(45) Date of Patent: Feb. 19, 2008

(54) SLURRY FOR CMP, POLISHING METHOD AND METHOD OF MANUFACTURING SEMICONDUCTOR DEVICE

(75) Inventors: Gaku Minamihaba, Yokohama (JP); Yukiteru Matsui, Yokohama (JP); Hiroyuki Yano, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/407,945

(22) Filed: Apr. 21, 2006

(65) Prior Publication Data

US 2006/0197055 A1    Sep. 7, 2006

Related U.S. Application Data

(62) Division of application No. 10/838,261, filed on May 5, 2004, now Pat. No. 7,060,621.

(30) Foreign Application Priority Data

Jun. 18, 2003    (JP) ............................. 2003-173263

(51) Int. Cl.
*C09K 13/00*    (2006.01)
(52) U.S. Cl. .................... 252/79.1; 252/79.2; 438/693
(58) Field of Classification Search ................ 438/691, 438/692, 693; 252/79.1, 79.2
See application file for complete search history.

(56) References Cited

U.S. PATENT DOCUMENTS

| | | | |
|---|---|---|---|
| 5,904,159 A | 5/1999 | Kato et al. | |
| 6,398,827 B1 * | 6/2002 | Ota et al. | 51/308 |
| 6,551,175 B2 | 4/2003 | Koichi et al. | |
| 2001/0018270 A1 * | 8/2001 | Tsuchiya et al. | 438/689 |
| 2002/0023389 A1 | 2/2002 | Minamihaba et al. | |
| 2003/0017786 A1 | 1/2003 | Minamihaba et al. | |

FOREIGN PATENT DOCUMENTS

| | | |
|---|---|---|
| JP | 2002-141314 | 5/2002 |
| JP | 2003-31529 | 1/2003 |
| JP | 2004-335664 | 11/2004 |

OTHER PUBLICATIONS

Japanese Patent Office Notification of Reasons for Rejection.
Japanese Patent Office Notification of Reasons for Rejection, no date avail.

* cited by examiner

*Primary Examiner*—Lan Vinh
(74) *Attorney, Agent, or Firm*—Finnegan, Henderson, Farabow, Garrett & Dunner, L.L.P.

(57) ABSTRACT

Disclosed is a CMP slurry comprising a first colloidal particle having a primary particle diameter ranging from 5 nm to 30 nm and an average particle diameter of d1, the first colloidal particle being incorporated in an amount of w1 by weight and a second colloidal particle having a primary particle diameter larger than that of the first colloidal particle and an average particle diameter of d2, the second colloidal particle being formed of the same material as that of the first colloidal particle and incorporated in an amount of w2 by weight, wherein d1, d2, w1 and w2 are selected to concurrently meet following conditions (A) and (B) excluding situations where d1, d2, w1 and w2 concurrently meet following conditions (C) and (D):

$3 \leq d2/d1 \leq 8$    (A)

$0.7 \leq w1/(w1+w2) \leq 0.97$    (B)

$3 \leq d2/d1 \leq 5$    (C)

$0.7 \leq w1/(w1+w2) \leq 0.9$.    (D)

15 Claims, 2 Drawing Sheets

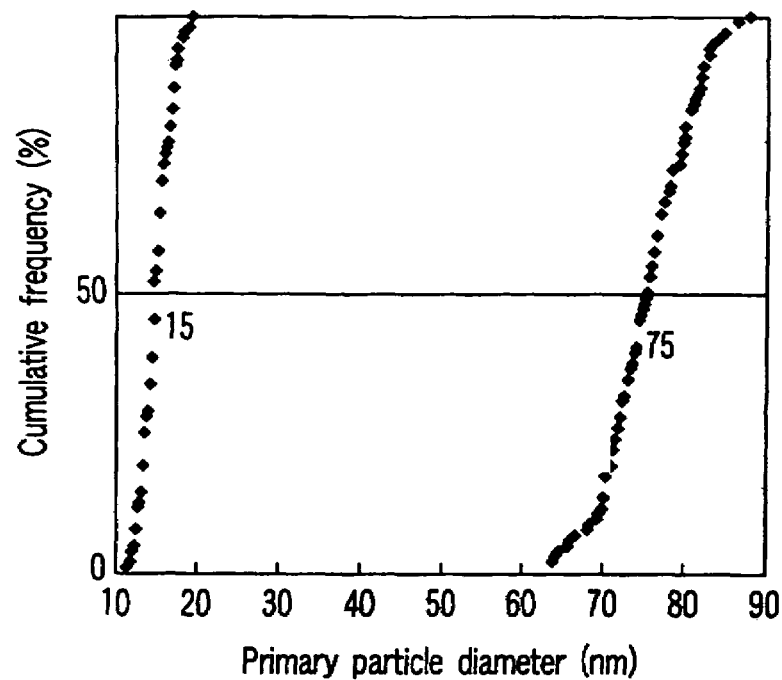
F I G. 1
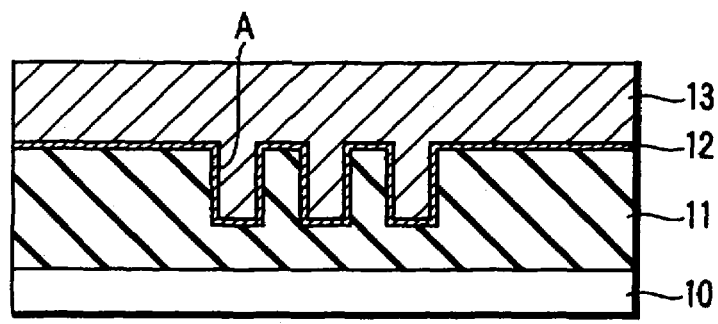
F I G. 2A
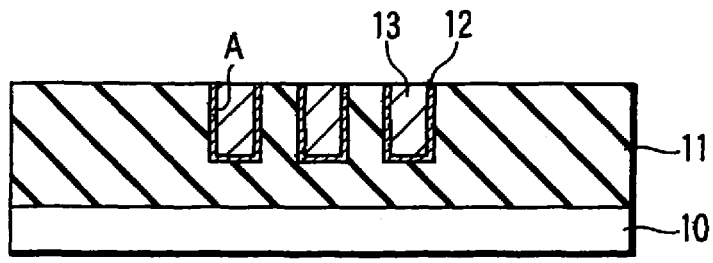
F I G. 2B

SLURRY FOR CMP, POLISHING METHOD AND METHOD OF MANUFACTURING SEMICONDUCTOR DEVICE

CROSS-REFERENCE TO RELATED-APPLICATIONS

This application is based upon and claims the benefit of priority from prior Japanese Patent Application No. 2003-173263, filed Jun. 18, 2003, the entire contents of which are incorporated herein by reference.

This is a division of application Ser. No. 10/838,261, filed May 5, 2004, now U.S. Pat. No. 7,060,621 the disclosure of which is incorporated herein by reference.

BACKGROUND OF THE INVENTION

1. Field of the Invention

The present invention relates to a slurry to be used for CMP (Chemical Mechanical Polishing), a polishing method using the slurry, and a method of manufacturing a semiconductor device.

2. Description of the Related Art

It is expected that the integration of semiconductor elements in high-performance LSIs of the next generation will be inevitably further enhanced. For example, the design rule of damascene wirings to be formed by CMP is expected to become so severe that the line width of wirings is will be confined within the range of 0.07 to 30 μm and the film thickness of wirings will be confined to not more than 100 nm.

Therefore, in designing a slurry for CMP, it is required to take these conditions into account and to employ abrasive grains which are sufficiently small relative to the line width of wirings so as to make it possible to perform fine and delicate polishing. For example, there has been proposed employing a slurry comprising two or more colloidal silica whose primary particle diameter is controlled. These slurries are capable of polishing a polishing surface while suppressing the generation of erosion and scratching if the polishing surface is constituted of a soft material or by a sole material, thereby enabling these slurries to exhibit excellent CMP performances. However, if the polishing surface is constituted of a hard material such as Ta or SiO$_2$, these slurries are incapable of performing the polishing at a sufficiently high polishing speed. Further, there is a problem that if the polishing surface is constituted of two or more materials, it is difficult to adjust the polishing balance so as to enable plural materials to be polished at the same polishing rate as each other.

BRIEF SUMMARY OF THE INVENTION

A CMP slurry according to one aspect of the present invention comprises a CMP slurry comprising a first colloidal particle having a primary particle diameter ranging from 5 nm to 30 nm and an average particle diameter of d1, the first colloidal particle being incorporated in an amount of w1 by weight; and a second colloidal particle having a primary particle diameter larger than that of the first colloidal particle and an average particle diameter of d2, the second colloidal particle being formed of the same material as that of the first colloidal particle and incorporated in an amount of w2 by weight; wherein d1, d2, w1 and w2 are selected to concurrently meet following conditions (A) and (B) excluding situations where d1, d2, w1 and w2 concurrently meet following conditions (C) and (D):

$3 \leq d2/d1 \leq 8$ (A)

$0.7 \leq w1/(w1+w2) \leq 0.97$ (B)

$3 \leq d2/d1 \leq 5$ (C)

$0.7 \leq w1/(w1+w2) \leq 0.9$ (D)

A polishing method according to one aspect of the present invention comprises a polishing method comprising: contacting a polishing surface of a semiconductor substrate with a polishing pad attached to a turntable; and dropping a CMP slurry onto the polishing pad to polish the polishing surface, the CMP slurry comprising a first colloidal particle having a primary particle diameter ranging from 5 nm to 30 nm and an average particle diameter of d1, the first colloidal particle being incorporated in an amount of w1 by weight and a second colloidal particle having a primary particle diameter larger than that of the first colloidal particle and an average particle diameter of d2, the second colloidal particle being formed of the same material as that of the first colloidal particle and incorporated in an amount of w2 by weight, d1, d2, w1 and w2 being selected to concurrently meet following conditions (A) and (B) excluding situations where d1, d2, w1 and w2 concurrently meet following conditions (C) and (D):

$3 \leq d2/d1 \leq 8$ (A)

$0.7 \leq w1/(w1+w2) \leq 0.97$ (B)

$3 \leq d2/d1 \leq 5$ (C)

$0.7 \leq w1/(w1+w2) \leq 0.9$ (D)

A method of manufacturing a semiconductor device according to one aspect of the present invention comprises a method of manufacturing a semiconductor device comprising forming an insulating film above a semiconductor substrate; forming a recessed portion in the insulating film; depositing a wiring material inside the recessed portion and on the insulating film through a barrier film to form a conductive layer; and removing the conductive layer deposited on the insulating film by CMP using a CMP slurry to expose the surface of the insulating film while selectively leaving the conductive layer in the recessed portion, the CMP slurry comprising a first colloidal particle having a primary particle diameter ranging from 5 nm to 30 nm and an average particle diameter of d1, the first colloidal particle being incorporated in an amount of w1 by weight and a second colloidal particle having a primary particle diameter larger than that of the first colloidal particle and an average particle diameter of d2, the second colloidal particle being formed of the same material as that of the first colloidal particle and incorporated in an amount of w2 by weight, d1, d2, w1 and w2 being selected to concurrently meet following conditions (A) and (B) excluding situations where d1, d2, w1 and w2 concurrently meet following conditions (C) and (D):

$3 \leq d2/d1 \leq 8$ (A)

$0.7 \leq w1/(w1+w2) \leq 0.97$ (B)

$3 \leq d2/d1 \leq 5$ (C)

$0.7 \leq w1/(w1+w2) \leq 0.9$ (D)

BRIEF DESCRIPTION OF THE SEVERAL VIEWS OF THE DRAWING

FIG. 1 is a graph showing the particle size distribution of colloidal particle;

FIGS. 2A and 2B are cross-sectional views each illustrating, stepwise, the method of manufacturing a semiconductor device according to one embodiment of the present invention;

DETAILED DESCRIPTION OF THE INVENTION

Figure 3:
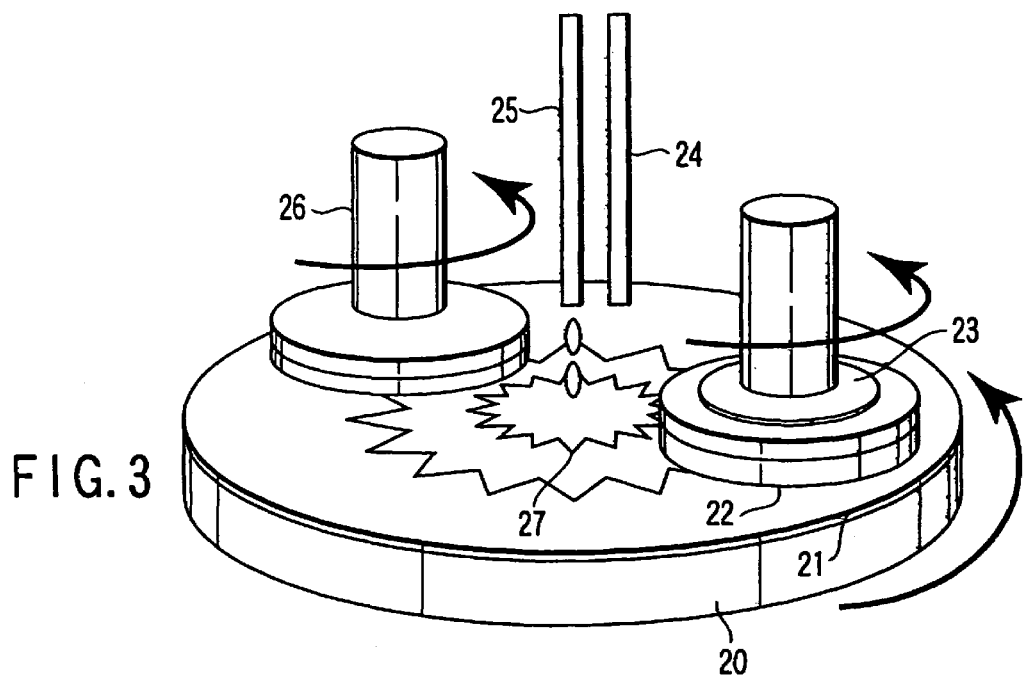
FIG. 3 is a perspective view schematically illustrating a state of CMP.

Next, the specific embodiments of the present invention will be explained as follows.

In the slurry for CMP (hereinafter referred to also as CMP slurry) according to the embodiments of the present invention, examples of colloidal particle include colloidal silica particle. This colloidal silica particle can be obtained by the hydrolysis, by sol-gel method, of silicon alkoxide compounds such as $Si(OC_2H_5)_4$, $Si(sec-OC_4H_9)_4$, $Si(OCH_3)_4$ and $Si(OC_4H_9)_4$. As for the colloidal particles, it is possible to employ colloidal alumina.

Among these colloidal particles, those where the primary particle diameter thereof ranges from 5 nm to 30 nm can be employed as a first colloidal particle. If the primary particle diameter of the colloidal particle is less than 5 nm, the polishing property of the slurry containing such a colloidal particle as an abrasive grain would be degraded. On the other hand, if the primary particle diameter of the colloidal particle is larger than 30 nm, erosion and scratching would be caused on a polishing surface on the occasion of polishing the polishing surface by using slurry containing such a colloidal particle as an abrasive grain. The primary particle diameter of the first colloidal particle should preferably be confined within the range of 10 nm to 20 nm.

The particle whose primary particle diameter is larger than that of the first colloidal particle and which is formed of the same material as that of the first colloidal particle is employed as the second colloidal particle. However, the average particle diameter and mixing ratio of the second colloidal particle are selected so as to meet a specific relationship.

In the embodiments of the present invention, the first and the second colloidal particles differ in the primary particle diameter from each other have respectively a very sharp size distribution which does not overlap with a very sharp size distribution of the other colloidal particles. The graph of FIG. 1 shows one example of the size distribution wherein an average particle diameter (d1) of the first colloidal silica is 15 nm, an average particle diameter (d2) of the second colloidal silica is 75 nm, and the ratio in difference of particle diameters (d2/d1) is 5.

The primary particle diameter of the colloidal silica can be determined through observation by an SEM or TEM. For example, after being diluted, slurry is uniformly deposited on a sample table and heated to evaporate the liquid component to form a layer. Thereafter, gold for example is vapor-deposited on the layer and the resultant layer is observed by an SEM and photographed at a magnification of 100,000 to 500,000 times. Thereafter, the maximum particle diameter of the particle is measured by using calipers. Then, a diameter is determined by drawing a perpendicular bisector relative to the maximum particle diameter, and an added average of values obtained from the diameter thus determined is assumed as the primary particle diameter. After 100 values in number of the primary particle diameter have been determined, these values are employed to draw a cumulative grain size curve, from which a primary particle diameter at 50% is assumed as an average particle diameter.

The CMP slurry according to the embodiments of the present invention can be prepared by dispersing the abrasive grain containing the first colloidal particle and the second colloidal particle in water such as pure water. The abrasive grain containing the first colloidal particle and the second colloidal particle should preferably be included in the slurry at a ratio of 0.1 wt % to 20 wt %. If the content of the abrasive grain is less than 0.1 wt %, the polishing properties of the slurry containing such an abrasive grain would be degraded. On the other hand, if the content of the abrasive grain exceeds 20 wt %, erosion and scratch would be caused on the polishing surface on the occasion of polishing the polishing surface by using a slurry containing such this abrasive grain. The content of the abrasive grain should more preferably be confined within the range of 0.5 wt % to 10 wt %.

If required, the CMP slurry according to the embodiments of the present invention may be formulated so as to include an oxidizing agent, an oxidation inhibitor, a surfactant, etc.

As for the oxidizing agent, it is possible to employ ammonium persulfate, potassium persulfate, hydrogen peroxide, ferric nitrate, ammonium cerium nitrate, etc. These oxidizing agents should preferably be included in the slurry at a ratio of 0.1 to 5% by weight.

As for the oxidation inhibitor, they include organic acids such as quinaldinic acid, quinolinic acid, malonic acid, oxalic acid, succinic acid, etc.; amino acids such as glycine, alanine, tryptophan, etc.; BTA (benzotriazole), etc. Among them, in terms of handling, quinaldinic acid, quinolinic acid and glycine are more preferable for use. The oxidation inhibitor should preferably be included in the slurry at a ratio of 0.01 to 3% by weight.

As for the surfactant, they include, for example, anionic surfactants, cationic surfactants and nonionic surfactants. These surfactants are capable of minimizing erosion and scratching on the occasion of polishing. As for specific examples of the surfactants, they include dodecylbenzene sulfonic acid, polyoxyethylene alkylamine, polyoxyethylene lauryl ether, acetylene diol-based nonion, etc. The surfactants should preferably be included in the slurry at a ratio of 0.01 to 1% by weight.

As for the pH of the CMP slurry according to the embodiments of the present invention, there is not any particular limitation, and hence, the CMP slurry may be employed with the pH thereof being falling within the range of 0.5 to 12. The pH of the CMP slurry can be adjusted to 11 or so by using, for example, KOH as a pH adjustor.

Since the ratio in difference of particle diameters as well as the mixing ratio of two colloidal particles are regulated respectively to a specific range in the CMP slurry according to the embodiments of the present invention, it is possible, through the employment of this CMP slurry, to polish a polishing surface while suppressing erosion or scratching on the polishing surface. Moreover, it is now also possible, through the employment of this CMP slurry, to polish a surface of hard materials at substantially the same high polishing rate as that in polishing a soft material.

Embodiment 1

First of all, a first colloidal silica having an average particle diameter (d1) of 15 nm, and a second colloidal silica having an average particle diameter (d2) which was larger than that of the first colloidal silica were variously combined to prepare various slurries.

Specifically, the average particle diameter (d2) of the second colloidal silica was variously altered within the range of 15 nm to 135 nm to obtain various ratios in difference of particle diameters (d2/d1) ranging from 1 to 9. Further, the weight (w1) of the first colloidal silica relative to the total weight (w1+w2) of colloidal silica was altered within the range of 0.65 to 1.0 to prepare various colloidal silica mixtures.

2 wt % of colloidal silica mixture, 2 wt % of ammonium persulfate as an oxidizing agent, 0.2 wt % of quinaldinic acid, 0.3 wt % of quinolinic acid, 0.3 wt % of glycine as an oxidation inhibitor, and an additive were added to pure water to obtain various solutions, to which KOH was added thereto to adjust the pH thereof to 9 to prepare various slurries.

By using these slurries thus obtained, a Cu damascene wiring was formed. FIGS. 2A and 2B are cross-sectional views each illustrating the steps of forming the Cu damascene wiring.

First of all, as shown in FIG. 2A, an insulating film 11 was deposited on a semiconductor substrate 10 having semiconductor elements formed thereon, and holes "A" 0.1 μm in width and 0.1 μm in depth were formed. Further, by a sputtering method and a plating method, a Cu film 13 having a thickness of 150 nm for forming wirings was deposited, via a barrier film, i.e. a Ta film 12 having a thickness of 10 nm, the entire surface of the insulating film ($SiO_2$ film) 11 provided with the holes "A".

Then, the redundant portions of the Ta film 12 and the Cu film 13 were removed by CMP to expose the surface of the insulating film 11 as shown in FIG. 2B, thus selectively leaving the Ta film 12 and the Cu film 13 in the holes "A".

This polishing by CMP was performed as follows by using IC1000 (trademark; Rodel Nitta Co., Ltd.) as a polishing pad and the slurries prepared as described above. Namely, as shown in FIG. 3, while rotating a turntable 20 having a polishing pad 21 attached thereto at a speed of 100 rpm, a top ring 23 holding a semiconductor substrate 22 was allowed to contact with the turntable 20 at a polishing load of 300 gf/$cm^2$. The rotational speed of the top ring 23 was set to 102 rpm, and the slurry 27 was fed onto the polishing pad 21 from a slurry supply nozzle 25 at a flow rate of 200 cc/min. Incidentally, FIG. 3 also shows a water supply nozzle 24 and a dresser 26.

By using each slurry, the Ta film 12, the Cu film 13 and the $SiO_2$ film 11 were polished to investigate the polishing rate, dishing and scratching of each of these films to evaluate these slurries. Namely, these slurries were respectively evaluated in such a manner that when each slurry satisfied all of the conditions that the polishing rate of any of the Cu film 13, the Ta film 12 and the $SiO_2$ film 11 was not less than 30 nm/min., the erosion was less than 20 nm, and the number of scratches on the surfaces of the Cu film 13 and the $SiO_2$ film 11 was less than 10/$cm^2$, the slurry was considered very good and marked by a symbol of "⊚".

When the number of scratches on the surfaces of the Cu film 13 and the $SiO_2$ film 11 was not less than 10/$cm^2$ but less than 20/$cm^2$, the slurry was considered good and marked by a symbol of "O". When the number of scratches on the surfaces of the Cu film 13 and the $SiO_2$ film 11 was not less than 20/$cm^2$ but less than 40/$cm^2$, the slurry was considered fair and marked by a symbol of "Δ". Further, when the polishing rate of any one of the Ta film 12 and the $SiO_2$ film 11 was less than 30 nm/min., the slurry was considered fair and marked by a symbol of "Δ". When the polishing rate of both of the Ta film 12 and the $SiO_2$ film 11 was less than 30 nm/min., the slurry was considered bad and marked by a symbol of "x". When the number of scratches on the surfaces of the Cu film 13 and the $SiO_2$ film 11 was not less than 40/$cm^2$, the slurry was considered bad and marked by a symbol of "x".

The results thus obtained are summarized in the following Table 1.

TABLE 1

| w1/(w1 + w2) | Ratio in difference of particle diameter (d2/d1) | | | | | | | | |
|---|---|---|---|---|---|---|---|---|---|
| | 1 | 2 | 3 | 4 | 5 | 6 | 7 | 8 | 9 |
| 0.65 | X | X | X | X | X | X | X | X | X |
| 0.7 | X | X | X | X | Δ | O | O | O | X |
| 0.75 | X | X | X | X | Δ | O | O | O | X |
| 0.8 | X | X | X | X | Δ | ⊚ | ⊚ | O | X |
| 0.85 | X | X | X | X | Δ | ⊚ | ⊚ | O | X |
| 0.9 | X | X | Δ | Δ | Δ | ⊚ | ⊚ | O | X |
| 0.91 | X | X | O | ⊚ | ⊚ | ⊚ | ⊚ | O | X |
| 0.92 | X | X | ⊚ | ⊚ | ⊚ | ⊚ | ⊚ | O | X |
| 0.93 | X | X | ⊚ | ⊚ | ⊚ | ⊚ | ⊚ | O | X |
| 0.94 | X | X | ⊚ | ⊚ | ⊚ | ⊚ | ⊚ | O | X |
| 0.95 | X | X | ⊚ | ⊚ | ⊚ | ⊚ | ⊚ | O | X |
| 0.96 | X | X | ⊚ | ⊚ | ⊚ | ⊚ | ⊚ | O | X |
| 0.97 | X | X | O | O | O | O | O | O | X |
| 0.98 | X | X | X | X | X | X | X | X | X |
| 1 | X | X | X | X | X | X | X | X | X |

In the region of "⊚", since all of the Cu film 13, the Ta film 12 and the $SiO_2$ film 11 can be polished at a polishing rate of not less than 30 nm/min., the slurries falling within this region are especially suited for forming a Cu multilayer wiring. Since it is possible, through the employment of the slurries falling within this region, to obviate the generation of short-circuit of wirings resulting from a residue of Cu and moreover to secure a sufficient power to polish the $SiO_2$ film, it is now possible to perform the polishing so as to minimize the development of step portion of the underlying layer (STI or W plug) on the occasion of the CMP of Cu layer constituting an uppermost layer.

Even in the region of "O", since most of the scratches generated are relatively shallow, hey were not fatal to a semiconductor device. The slurries which fall within the regions of "⊚" and "O" meet the conditions for the first colloidal particle and the second colloidal particle according to the embodiments of the present invention.

If the polishing rate of any one of the Ta film 12 and the $SiO_2$ film 11 is less than 30 nm/min., it would be impossible to polish a soft material such as a Cu film and the aforementioned hard materials at substantially an equivalent polishing rate to each other.

Figure 4:
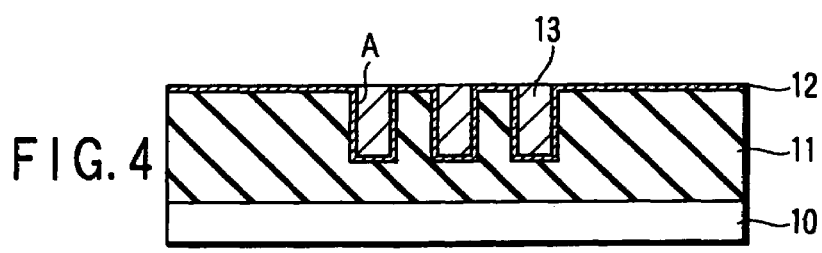
FIG. 4 is a cross-sectional view illustrating one step in the manufacturing method of a semiconductor device where conventional slurry for CMP is employed.

Therefore, when the Ta film 12 and the Cu film 13 are selectively buried in the holes "A" as shown in FIG. 2B, it is required at first to remove a redundant portion of the Cu film 13 which is disposed over the Ta film 12 and then to separately perform the CMP (touch-up step) of the Ta film 12 to expose the surface of the insulating film 11 as shown in FIG. 4.

In the region of "Δ", even though the total number of scratches generated was relatively small, scratches each having such a large depth that is fatal to a semiconductor device existed at a ratio of 10/cm² or more.

It is now possible, through the employment of the CMP slurry according to the embodiments of the present invention, to remove redundant portions of the Cu film and Ta film by a single polishing step and to form a damascene wiring. Therefore, the CMP slurry according to the embodiment of the present invention is advantageous in terms of reducing not only the number of manufacturing steps but also the manufacturing cost.

It was possible to obtain almost the same effects as described above even if the material of the barrier film was changed to Ti, Nb, V, W or Mo. Namely, irrespective of the materials of the barrier film, it is now possible, through the employment of the CMP slurry according to the embodiment of the present invention, to polish the barrier film together with a wiring material.

Embodiment 2

Figure 5A:
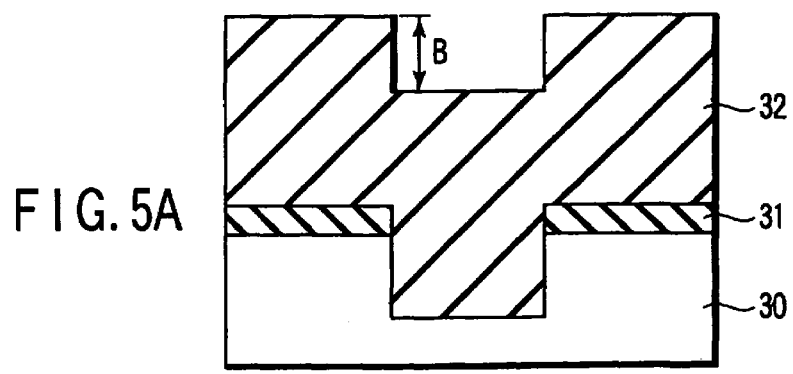
FIGS. 5A and 5B are cross-sectional views each illustrating, stepwise, the method of manufacturing a semiconductor device according to another embodiment of the present invention.
Figure 5B:
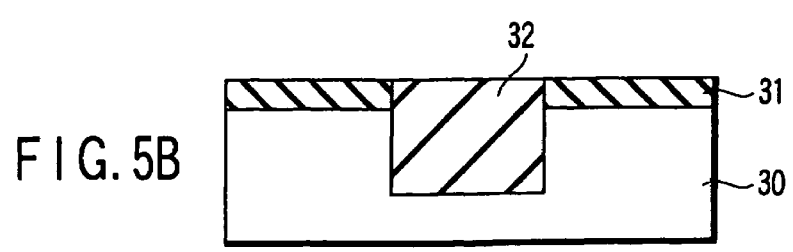

The CMP slurry according to the embodiments of the present invention were capable of application to the formation of STI (Shallow trench isolation). FIGS. 5A and 5B are cross-sectional views each illustrating the process of forming the STI.

First of all, as shown in FIG. 5A, a trench was formed on a semiconductor substrate 30 having a CMP stopper film 31, and then, an insulating film 32 was deposited thereon. In this case, SiN was employed as the CMP stopper film 31. As for the insulating film 32, a coating-type insulating film such as an organic SOG can be employed.

Then, a redundant portion of the insulating film 32 was removed by CMP using the slurry according to one embodiment of the present invention to expose the surface of the CMP stopper film 31 as shown in FIG. 5B.

In this embodiment, the slurry was prepared by using a first colloidal silica (an average particle diameter d1: 10 nm), and a second colloidal silica (an average particle diameter d2: 60 nm). The ratio in difference of particle diameters (d2/d1) was 6, and these two kinds of colloidal silica were mixed together so as to adjust the weight ratio of the first colloidal silica (w1/(w1+w2)) to 0.9 to prepare an abrasive grain. This abrasive grain was dispersed in pure water to obtain a solution containing this abrasive grain at a concentration of 10 wt % and the pH of the solution was adjusted to 11 by using KOH as a pH adjustor.

Then, by using the slurry thus obtained, an insulating film 32 was polished under the following conditions.

Flow rate of slurry: 300 cc/min;
Polishing pad: IC1000 (trademark; Rodel Nitta Co., Ltd.);
Load: 300 gf/cm².

Rotational speed of the top ring and turntable were both set to 100 rpm, and the polishing was performed for 3 minutes. Since the concentration of the particles in the slurry employed herein was relatively high, the resultant environment was such that scratches were liable to be generated.

Due to the employment of the slurry according to this embodiment, the number of the scratches generated on the surface of wafer after the polishing was confined to only two, and the erosion was suppressed to 30 nm or less. Thus, it was confirmed that the slurry according to this embodiment was effective in achieving the same effects as described above even in the CMP of the insulating film deposited on the CMP stopper film which was vulnerable to scratches.

The fact that the step portion "B" shown in FIG. 5B can be effectively flattened is also one of the characteristics of the CMP slurry of this embodiment of the present invention. In this embodiment, the scraping in the CMP was performed down to the CMP stopper film 31. However, the CMP using the CMP slurry may be performed in such a process that only the step portion "B" is flattened and the CMP is stopped at a midway of the insulating film 32.

For the purpose of comparison, a slurry was prepared in such a manner as to adjust the weight ratio of the first colloidal silica (w1/(w1+w2)) to 0.9 by following the same procedures as described above except that the second colloidal silica was selected so as to regulate the ratio in difference in particle diameters (d2/d1) to 3.

By using this slurry thus obtained, the polishing of the insulating film was performed under the same conditions as described above. As a result, the number of scratches generated on the surface of the wafer after the polishing was 320 and the erosion was found to be 35 nm approximately.

As described above, it has been confirmed that if the conditions on the first and second colloidal particles exceed beyond the ranges defined by the embodiments of the present invention, the state of polished surface after the polishing step would be degraded.

As explained above, according to the embodiments of the present invention, it is possible to provide a CMP slurry which is capable of suppressing the generation of erosion as well as scratching and also capable of polishing a polishing surface constituted of two or more materials differing in hardness from each other at a practically acceptable polishing rate and at an equivalent polishing rate to each other. According to another embodiment of the present invention, it is possible to provide a polishing method which is capable of suppressing the generation of erosion as well as scratching and also capable of polishing the polishing surface at a practically acceptable polishing rate. According to a further embodiment of the present invention, it is possible to provide a method of manufacturing a semiconductor device which is excellent in reliability.

According to the embodiments the present invention, it is now possible to manufacture a semiconductor device of high-performance and high-processing speed and having fine wirings of 0.1 μm of less in design rule which will be demanded in the wirings of the next generation. Therefore, the present invention will be very valuable from an industrial viewpoint.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A CMP slurry comprising:
a first colloidal particle having a primary particle diameter ranging from 5 nm to 30 nm and an average particle diameter of d1, the first colloidal particle being incorporated in an amount of w1 by weight; and
a second colloidal particle having a primary particle diameter larger than that of the first colloidal particle and an average particle diameter of d2, the second colloidal particle being formed of the same material as that of the first colloidal particle and incorporated in an amount of w2 by weight;

wherein d1, d2, w1 and w2 are selected to concurrently meet following conditions (A) and (B) excluding situations where d1, d2, w1 and w2 concurrently meet following conditions (C) and (D):

$$3 \leq d2/d1 \leq 8 \quad (A)$$

$$0.7 \leq w1/(w1+w2) \leq 0.97 \quad (B)$$

$$3 \leq d2/d1 \leq 5 \quad (C)$$

$$0.7 \leq w1/(w1+w2) \leq 0.9 \quad (D).$$

2. The CMP slurry according to claim 1, wherein the first colloidal particle and the second colloidal particle are both formed of colloidal silica particle.

3. The CMP slurry according to claim 1, wherein a total content of the first and second colloidal particles is within the range of 0.1 wt % to 20 wt % of the slurry.

4. The CMP slurry according to claim 1, wherein the diameter of primary particle of the first colloidal particle is within the range of 10 nm to 20 nm.

5. The CMP slurry according to claim 1, wherein a total content of the first and second colloidal particles is within the range of 0.5 wt % to 10 wt % of the slurry.

6. A CMP slurry comprising:
a first colloidal particle having a primary particle diameter ranging from 5 nm to 30 nm and an average particle diameter of d1, the first colloidal particle being incorporated in an amount of w1 by weight; and
a second colloidal particle having a primary particle diameter larger than that of the first colloidal particle and an average particle diameter of d2, the second colloidal particle being formed of the same material as that of the first colloidal particle and incorporated in an amount of w2 by weight;
wherein d1, d2, w1 and w2 are selected to concurrently meet following conditions (1) and (2):

$$3 \leq d2/d1 \leq 8 \quad (1)$$

$$0.9 < w1/(w1+w2) \leq 0.97 \quad (2).$$

7. The CMP slurry according to claim 1, wherein the first colloidal particle and the second colloidal particle are both formed of colloidal silica particle.

8. The CMP slurry according to claim 1, wherein a total content of the first and second colloidal particles is within the range of 0.1 wt % to 20 wt % of the slurry.

9. The CMP slurry according to claim 1, wherein the diameter of primary particle of the first colloidal particle is within the range of 10 nm to 20 nm.

10. The CMP slurry according to claim 1, wherein a total content of the first and second colloidal particles is within the range of 0.5 wt % to 10 wt % of the slurry.

11. A CMP slurry comprising:
a first colloidal particle having a primary particle diameter ranging from 5 nm to 30 nm and an average particle diameter of d1, the first colloidal particle being incorporated in an amount of w1 by weight; and
a second colloidal particle having a primary particle diameter larger than that of the first colloidal particle and an average particle diameter of d2, the second colloidal particle being formed of the same material as that of the first colloidal particle and incorporated in an amount of w2 by weight;
wherein d1, d2, w1 and w2 are selected to concurrently meet following conditions (1) and (2):

$$5 < d2/d1 \leq 8 \quad (1)$$

$$0.7 \leq w1/(w1+w2) \leq 0.97 \quad (2).$$

12. The CMP slurry according to claim 11, wherein the first colloidal particle and the second colloidal particle are both formed of colloidal silica particle.

13. The CMP slurry according to claim 11, wherein a total content of the first and second colloidal particles is within the range of 0.1 wt % to 20 wt % of the slurry.

14. The CMP slurry according to claim 11, wherein the diameter of primary particle of the first colloidal particle is within the range of 10 nm to 20 nm.

15. The CMP slurry according to claim 11, wherein a total content of the first and second colloidal particles is within the range of 0.5 wt % to 10 wt % of the slurry.

* * * * *